US010879456B2

(12) United States Patent
Liou et al.

(10) Patent No.: US 10,879,456 B2
(45) Date of Patent: Dec. 29, 2020

(54) SIDEWALL SPACER STACK FOR MAGNETIC TUNNEL JUNCTIONS

(71) Applicant: Taiwan Semiconductor Manufacturing Co., Ltd., Hsinchu (TW)

(72) Inventors: Joung-Wei Liou, Hsinchu (TW); Chin Kun Lan, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/129,088

(22) Filed: Sep. 12, 2018

(65) Prior Publication Data

US 2020/0006641 A1 Jan. 2, 2020

Related U.S. Application Data

(60) Provisional application No. 62/690,724, filed on Jun. 27, 2018.

(51) Int. Cl.
*H01L 43/08* (2006.01)
*H01L 43/10* (2006.01)
*H01L 27/22* (2006.01)
*H01L 43/02* (2006.01)
*H01L 43/12* (2006.01)

(52) U.S. Cl.
CPC ............ *H01L 43/08* (2013.01); *H01L 27/226* (2013.01); *H01L 43/02* (2013.01); *H01L 43/10* (2013.01); *H01L 43/12* (2013.01)

(58) Field of Classification Search
CPC ......... H01L 43/08; H01L 43/12; H01L 43/02; H01L 27/226; H01L 43/10
See application file for complete search history.

(56) References Cited

U.S. PATENT DOCUMENTS

| | | | |
|---|---|---|---|
| 8,623,770 B1* | 1/2014 | Gao | H01L 21/02186 257/E21.236 |
| 9,515,252 B1* | 12/2016 | Annunziata | H01L 27/22 |
| 9,564,577 B1* | 2/2017 | Hsu | H01L 43/02 |
| 2016/0359101 A1* | 12/2016 | Kuo | H01L 43/02 |
| 2017/0053967 A1* | 2/2017 | Chuang | H01L 27/222 |
| 2017/0092850 A1* | 3/2017 | Lee | H01L 43/12 |
| 2017/0222128 A1* | 8/2017 | Sung | H01L 43/02 |
| 2019/0036014 A1* | 1/2019 | Ha | H01L 43/12 |
| 2019/0207103 A1* | 7/2019 | Pinarbasi | H01L 21/3065 |

* cited by examiner

Primary Examiner — Jerome Leboeuf
(74) Attorney, Agent, or Firm — Sterne, Kessler, Goldstein & Fox P.L.L.C.

(57) ABSTRACT

An exemplary method for forming spacer stacks with metallic compound layers is provided. The method includes forming magnetic tunnel junction (MTJ) structures on an interconnect layer and depositing a first spacer layer over the MTJ structures and the interconnect layer. The method also includes disposing a second spacer layer—which includes a metallic compound—over the first spacer material, the MTJ structures, and the interconnect layer so that the second spacer layer is thinner than the first spacer layer. The method further includes depositing a third spacer layer over the second spacer layer and between the MTJ structures. The third spacer is thicker than the second spacer.

20 Claims, 9 Drawing Sheets

SIDEWALL SPACER STACK FOR MAGNETIC TUNNEL JUNCTIONS

CROSS-REFERENCE TO RELATED APPLICATION

This application claims the benefit of U.S. Provisional Patent Application No. 62/690,724, titled "SPACER STACK FOR MAGNETIC TUNNEL JUNCTIONS," which was filed on Jun. 27, 2018 and is incorporated herein by reference in its entirety.

BACKGROUND

Magnetic tunneling junctions (MTJs) are an integral part of magnetic random access memories (MRAMs). A fabrication process of an MTJ structure can involve a variety of operations, such as metal and dielectric depositions, photolithography, etch processes, etc. MTJs can be formed between back end of the line (BEOL) interconnect layers and separated bilaterally by spacer stacks which can be formed on the sidewalls of each MTJ structure.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

DETAILED DESCRIPTION

Figure 1:
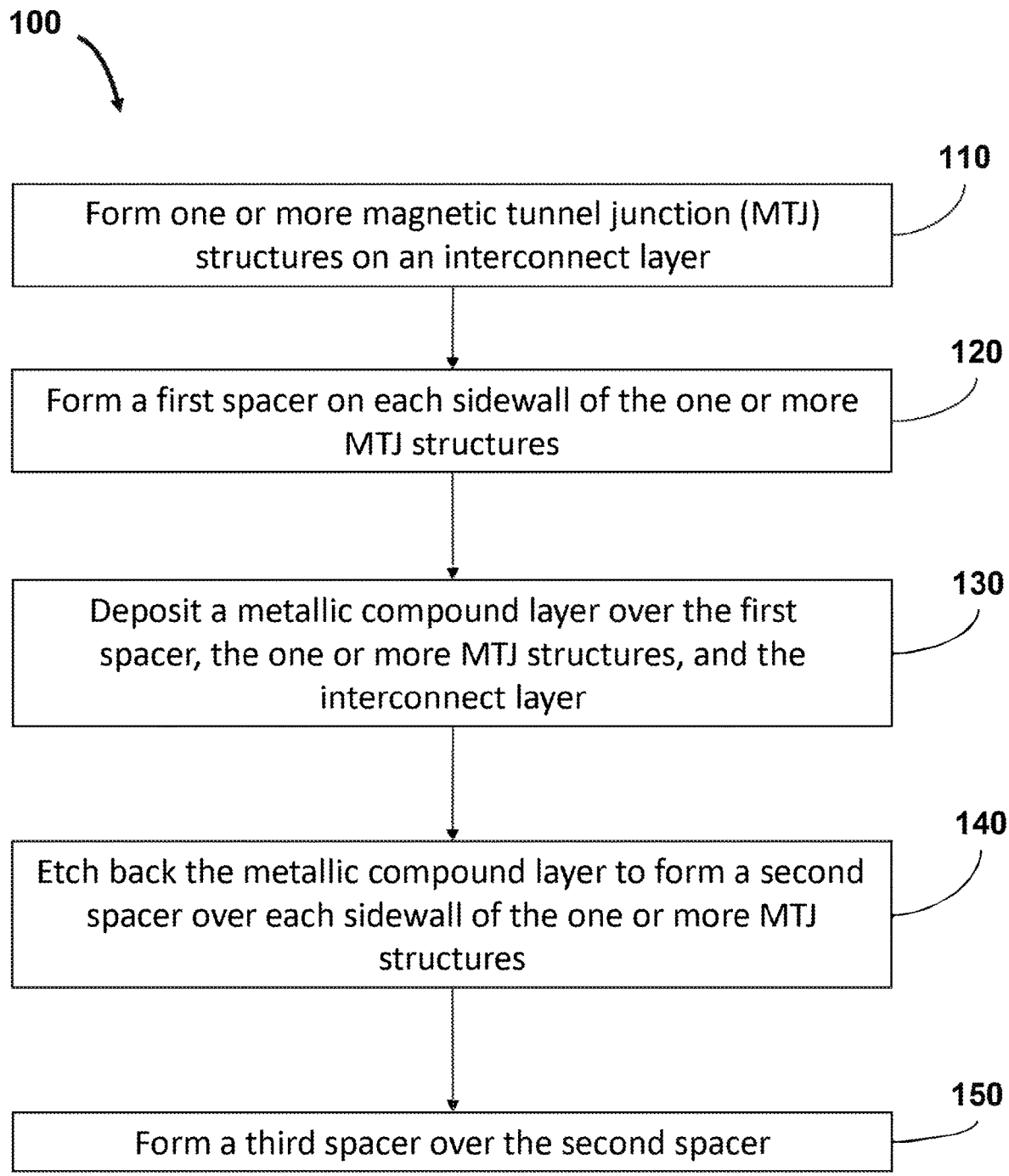
FIG. 1 is a flowchart of an exemplary fabrication method for forming magnetic tunnel junction structures with spacer stacks featuring metallic compound layers, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" as used herein indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

The term "nominal" as used herein refers to a desired, or target, value of a characteristic or parameter for a component or a process operation, set during the design phase of a product or a process, together with a range of values above and/or below the desired value. The range of values can be due to slight variations in manufacturing processes or tolerances. Unless defined otherwise, technical and scientific terms used herein have the same meanings as commonly understood by one of ordinary skill in the art to which this disclosure belongs.

As used herein, the term "substantially" indicates that the value of a given quantity varies by ±1% to ±5% of the value.

Magnetic tunneling junctions (MTJs) are an integral part of magnetic random access memories (MRAMs). A fabrication process of an MTJ structure can involve a variety of process operations, including metal and dielectric depositions, photolithography, etch operations, etc. MTJ structures can be interposed between back end of the line (BEOL) interconnect layers and separated bilaterally by spacer stacks formed on the sidewalls of each MTJ structure. The role of the spacer stacks is to electrically isolate the MTJ structures from one another. As the MRAM cells are scaled down from one technology generation (node) to the next, the pitch (e.g., the spacing) between adjacent MTJ structures is reduced. Consequently, thinner spacer stacks are required to fill the space between the MTJ structures. Keeping the MTJ structures in MRAM cells electrically isolated when the spacing between MTJ structures is reduced (e.g., below 92 nm) can be challenging for thinner spacer stacks, such as spacer stacks having a thickness below about 30 mm.

The embodiments described herein are directed to an exemplary fabrication method that describes the formation of spacer stacks. In some embodiments, the spacer stack thickness is below about 30 nm (e.g., about 25 nm) between MTJ structures, and the spacer stack pitch is between about 80 nm and about 92 nm. In some embodiments, the spacer stacks can include a metallic compound layer with improved dielectric properties (e.g., electrical isolation characteristics). The metallic compound layers can include aluminum oxide, aluminum nitride, titanium oxide, titanium nitride, ruthenium oxide, or any other suitable material and can have a thickness below about 5 nm (e.g., about 3 nm). The metallic compound layer can be interposed between layers of silicon nitride, silicon carbon nitride, silicon oxy-nitride, silicon oxy-carbon nitride, silicon oxide or combinations thereof to form a spacer stack on each sidewall surface of the MTJ structure. In some embodiments, the metallic compound layer is deposited with thermal atomic layer deposition or plasma-assisted atomic layer deposition. According to some embodiments, spacer stacks with metallic compound layers exhibit improved electrical isolation characteristics compared to spacer stacks without metallic compound layers. Consequently, spacer stack with metallic compound layer can be more compact (e.g., thinner).

FIG. 1 is a flowchart of an exemplary fabrication method 100 that describes the formation of MTJ spacer stacks with a metallic compound layer, according to some embodiments. According to some embodiments, the metallic compound layer can be deposited with thermal atomic layer deposition (ALD) or plasma-enhanced atomic layer deposition (PEALD) at a temperature range between about 150° C. and about 400° C. Fabrication method 100 is not limited to the operations described below. Other fabrication operations (e.g., wet cleans, additional photolithography and deposition operations, etc.) may be performed between the various operations of fabrication method 100 and may be omitted merely for clarity. These fabrication operations, even though not described, are within the spirit and the scope of the present disclosure.

Figure 2:
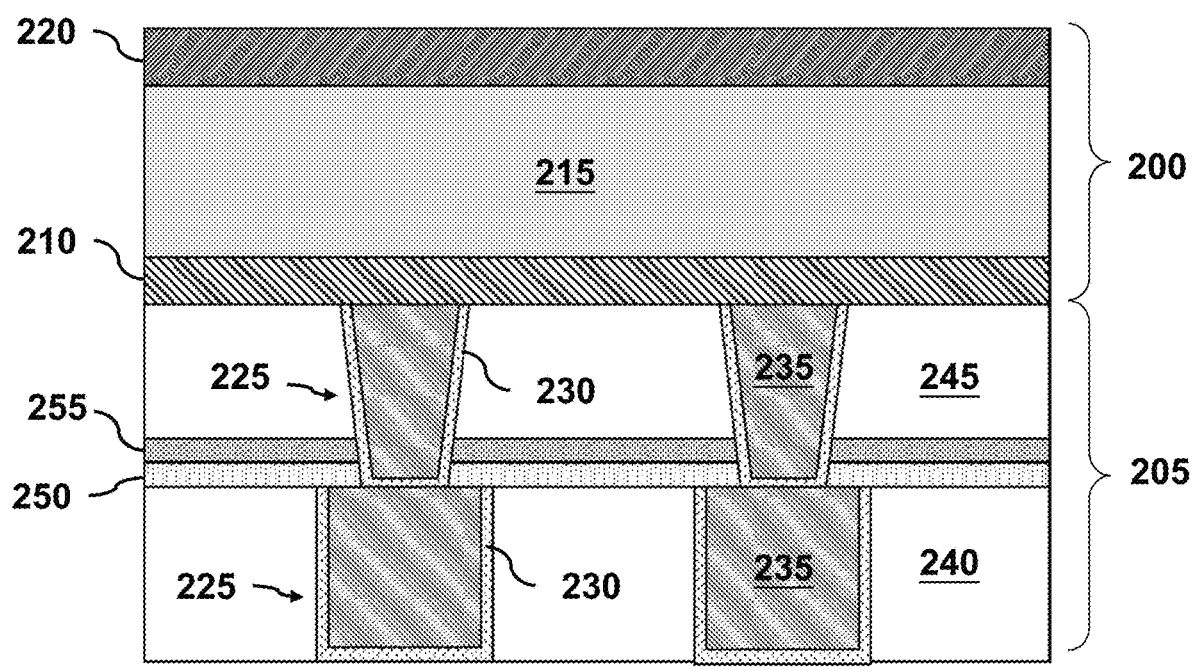
FIG. 2 is a cross-sectional view of exemplary magnetic tunnel junction layers over an interconnect layer, according to some embodiments.

In referring to FIG. 1, exemplary fabrication method 100 begins with operation 110 and the formation of one or more MTJ structures over an interconnect layer. The formation of one or more MTJ structures will be described using FIGS. 2 and 3 as examples. FIG. 2 is a cross-sectional view of blanket-deposited MTJ layers 200 over one or more interconnect layers 205. MTJ layers 200 can include a bottom electrode 210, an MTJ stack 215, and a top electrode 220. By way of example and not limitation, MTJ stack 215 can be a multilayer structure that includes a non-conductive layer interposed between two ferromagnetic layers. The non-conductive layer and the ferromagnetic layers in MTJ stack 215 are not shown in FIG. 2 for simplicity. By way of example and not limitation, the non-conductive layer of MTJ stack 215 can be include magnesium oxide (MgO), aluminum oxide ($AlO_x$), aluminum oxynitride (AlON), any other suitable material, or combinations thereof. Further, the non-conductive layer can be deposited by physical vapor deposition (PVD). Alternatively, the non-conductive layer may be deposited by other deposition methods, such as plasma-enhanced PVD (PEPVD), chemical vapor deposition (CVD), plasma-enhanced CVD (PECVD), ALD, PEALD, or any other suitable deposition method. The ferromagnetic layers of MTJ stack 215 can include metal stacks with one or more layers including iron (Fe), cobalt (Co), ruthenium (Ru), magnesium (Mg), any other suitable material, or combinations thereof. The ferromagnetic layers may be deposited by PVD, PEPVD, CVD, PEPVD, ALD, PEALD, or any other suitable deposition method. In some embodiments, the combined thickness of MTJ layers 200 can range from about 100 Å to about 400 Å.

Top electrode 220 and bottom electrode 210 are in contact with the respective ferromagnetic layers of MTJ stack 215. By way of example and not limitation, top electrode 220 can include tantalum (Ta), tantalum nitride (TaN), titanium nitride (TiN), tungsten (W), any other suitable material, or a combination thereof. Further, top electrode 220 can be deposited by CVD or PVD methods. In some embodiments, top electrode 220 can be a stack that includes TiN and TaN layers. Bottom electrode 210 can include TiN, TaN, Ru, copper (Cu), any other suitable material, or a combination thereof. Bottom electrode 210 can also be deposited by CVD or PVD methods. In some embodiments, top and bottom electrodes 220 and 210 can each have a thickness between about 300 Å and about 800 Å.

In some embodiments, interconnect layers 205 can be formed prior to the formation of MTJ layers 200. According to some embodiments, interconnect layers 205 can be formed over previously formed interconnect layers, which are not shown in FIG. 2 for simplicity. These previously formed interconnect layers may include, for example, BEOL interconnect layers, middle of the line (MOL) layers (e.g., contact interconnects), and field effect transistors (FETs) formed over a substrate (e.g., a wafer). By way of example and not limitation, interconnect layers 205 can be BEOL layers with several vertical interconnect access lines and lateral lines (also referred to herein as "lines"). Interconnect layers 205 in FIG. 2 are shown with vias 225, while lines are not included for simplicity. For example purposes, interconnect layers 205 will be described with vias 225. However, based on the disclosure herein, lines are also part of interconnect layers 205 and are within the spirit and scope of this disclosure. Further, the number of vias 225 shown in FIG. 2 is not limiting and additional vias 225 are possible.

According to some embodiments, vias 225 (and the lines) of interconnect layers 205 can be filled with a metal stack that includes at least a barrier layer 230 and a metal fill 235. Barrier layer 230 can be single layer or a stack of two or more layers. In some embodiments, metal fill 235 can be an electroplated metal or a metal alloy. By way of example and not limitation, barrier layer 230 can be a tantalum nitride (TaN)/tantalum (Ta) stack or a cobalt (Co) single layer deposited by PVD. Metal fill 235 can be electroplated copper or an electroplated copper alloy, such as copper-manganese, copper-ruthenium, or any other suitable material. The vias (e.g., vias 225) and the lines of interconnect layers 205 are embedded in interlayer dielectric (ILD) layers 240 and 245. In some embodiments, ILD layers 240 and 245 can be silicon oxide or a low-k material with dielectric constant lower than the dielectric constant of thermally grown silicon oxide (e.g., below 3.9). In some embodiments, ILD layers 240 and 245 can be a stack of dielectrics such as, for example, a low-k dielectric and another dielectric: (i) a low-k dielectric (e.g., carbon doped silicon oxide) and a silicon carbide with nitrogen doping; (ii) a low-k dielectric and a silicon carbide with oxygen doping; (iii) a low-k dielectric with silicon nitride; or (iv) a low-k dielectric with silicon oxide. Further, ILD layers 240 and 245 can be deposited with a high-density plasma CVD (HDPCVD) or a PECVD process. In some embodiments, ILD layer 240 can be a different from ILD layer 245. For example, ILD layer 240 can be carbon doped silicon oxide (SiOC) and ILD layer 245 can be silicon oxide. In some embodiments, etch stop layers, 250 and 255, are interposed between ILD layers 240 and 245. By way of example and not limitation, etch stop layer 250 can include silicon carbon nitride (SiCN) or aluminum nitride (AlN) and can have a thickness between about 10 Å and about 150 Å. Etch stop layer 255 can include aluminum oxide and can have a thickness between about 10 Å and about 40 Å. Etch stop layers 250 and 255 are used during the formation process of vias 225.

Lithography and etch operations can be used to pattern MTJ layers 200. As a result, one or more MTJ structures can be formed according to operation 110 of method 100. For example, a mask layer (not shown in FIG. 2), can be disposed and patterned over top electrode 220. The mask layer may include one or more layers and have a total thickness of about 750 Å. By way of example and not limitation, the mask layer can include a layer stack with a bottom oxide layer and a top amorphous carbon layer. Any portions of MTJ layers 200 that are not covered by the patterned mask layer can be removed during a subsequent etch operation.

Figure 3:
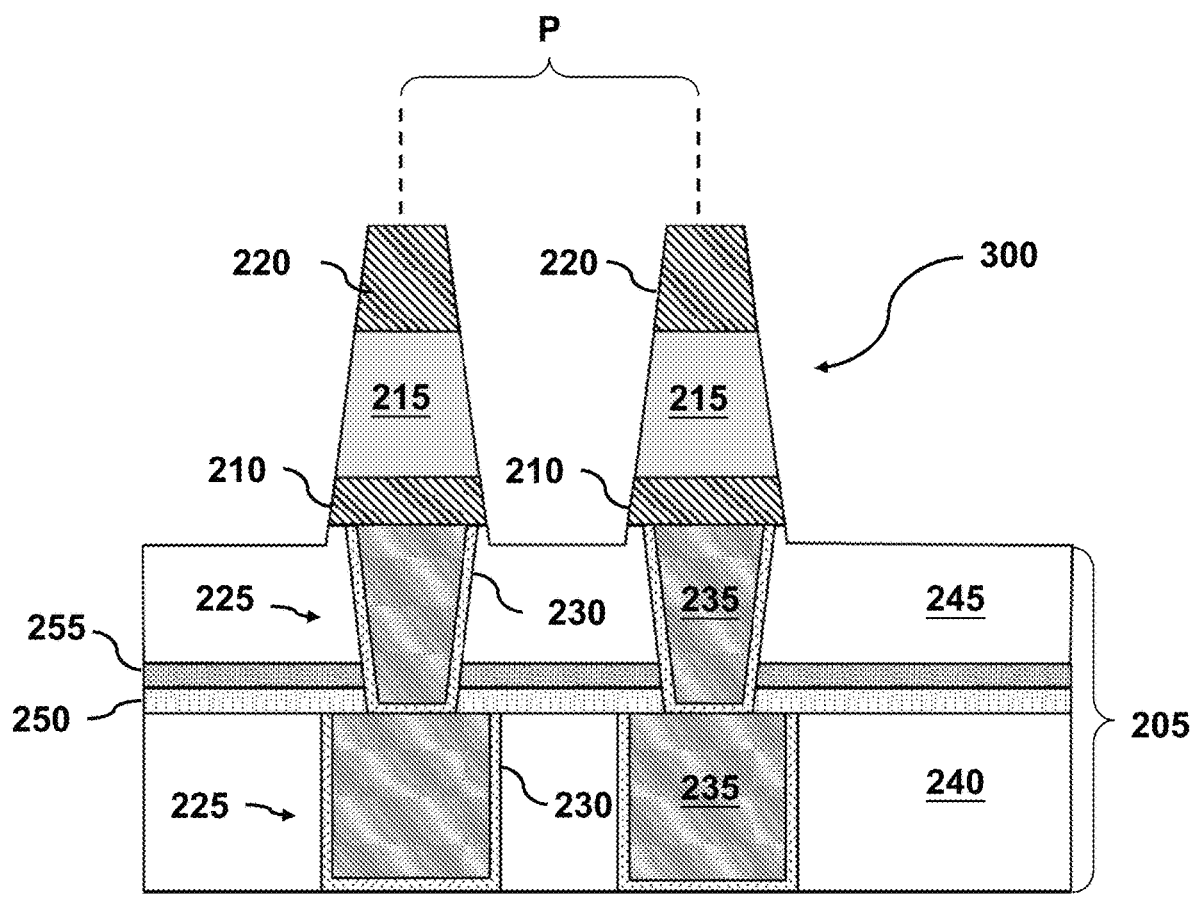
FIG. 3 is a cross-sectional view of magnetic tunnel junction structures over vias in an interconnect layer after photolithography and etch operations, according to some embodiments.

As shown in FIG. 3, MTJ structures 300 can be formed from the un-etched portions of MTJ layers 200 over interconnect layers 205. In some embodiments, the patterned mask layer is aligned to vias 225 of interconnect layers 205 so that MTJ structures 300 are formed on top of vias 225 as shown in FIG. 3. Therefore, each bottom electrode 210 of MTJ structures 300 can be in electrical and physical contact with a respective underlying via 225 of interconnect layer 205. Additionally, and as a result of the aforementioned etch process, the top surface of ILD layer 245 may be recessed with respect to a top surface of vias 225 during the formation of MTJ structures 300. After the etch process, the patterned mask layer on top of MTJ structures 300, which is not shown in FIG. 3, can be removed with a wet clean process.

According to some embodiments, a pitch P between adjacent MTJ structures 300 can range from about 92 nm to about 80 nm (e.g., about 82 nm) depending on the MRAM layout design. This means that the space between the sidewalls of adjacent (e.g., neighboring) MTJ structures 300 can be less than about 80 nm.

Figure 4:
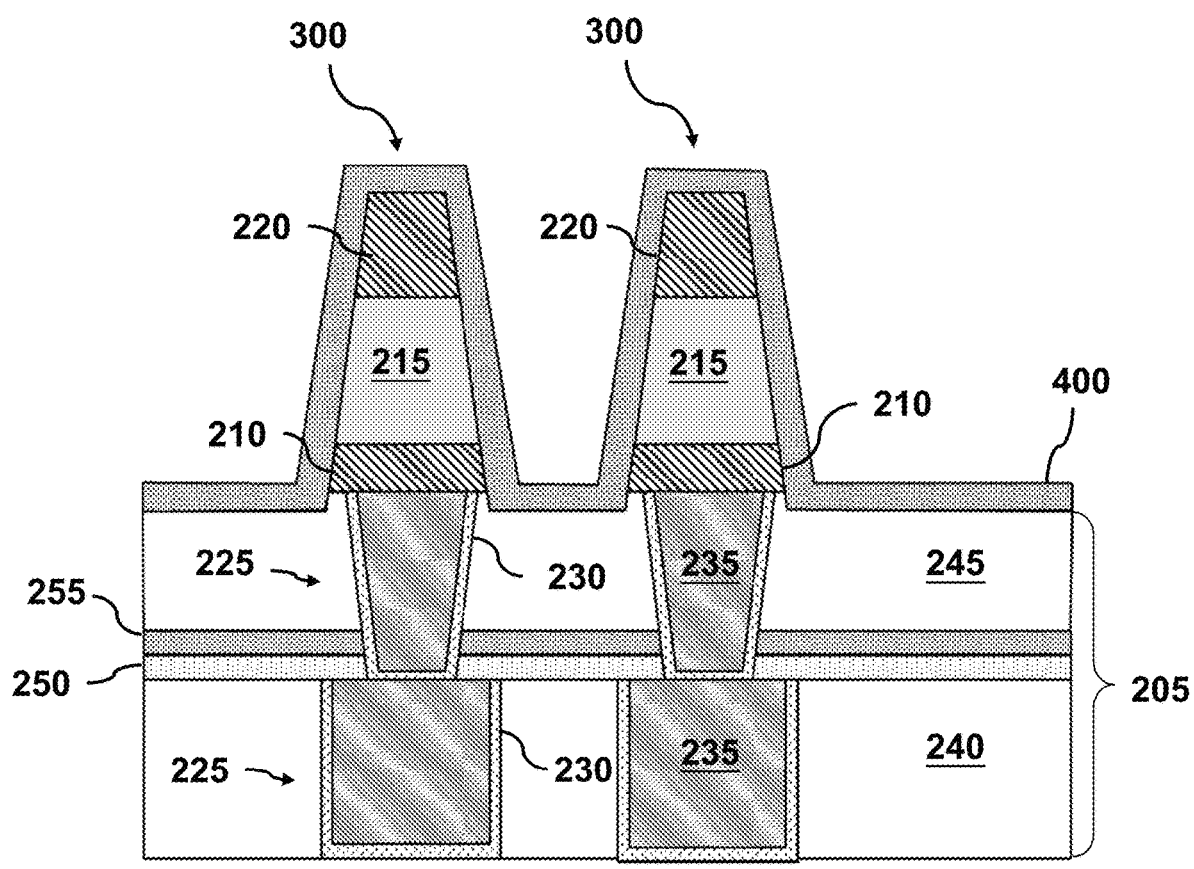
FIG. 4 is a cross-sectional view of magnetic tunnel junction structures over an interconnect layer after the deposition of a first spacer layer, according to some embodiments.

Referring to FIG. 1, method 100 continues with operation 120 and the formation of a first spacer on each sidewall of the one or more MTJ structures 300. By way of example and not limitation, the first spacer formation process can be described using FIGS. 4 and 5. In referring to FIG. 4, a first spacer material 400 can be blanket-deposited over MTJ structures 300 and ILD layer 245 at a thickness between about 30 Å and about 200 Å (e.g., about 150 Å). In some embodiments, spacer material 400 can include silicon nitride (SiN), silicon carbon nitride (SiCN), any suitable material, or combinations thereof. For example, first spacer material 400 can be a single layer or a stack with a SiN bottom layer and a SiCN top layer. In some embodiments, spacer material 400 can be conformally deposited with an atomic layer deposition (ALD) process or a chemical vapor deposition (CVD) process at a temperature between about 100° C. and about 400° C. During deposition, the process pressure can be between about 0.5 Torr and about 10 Torr. The aforementioned process pressure range is exemplary and other ranges may be used.

Figure 5:
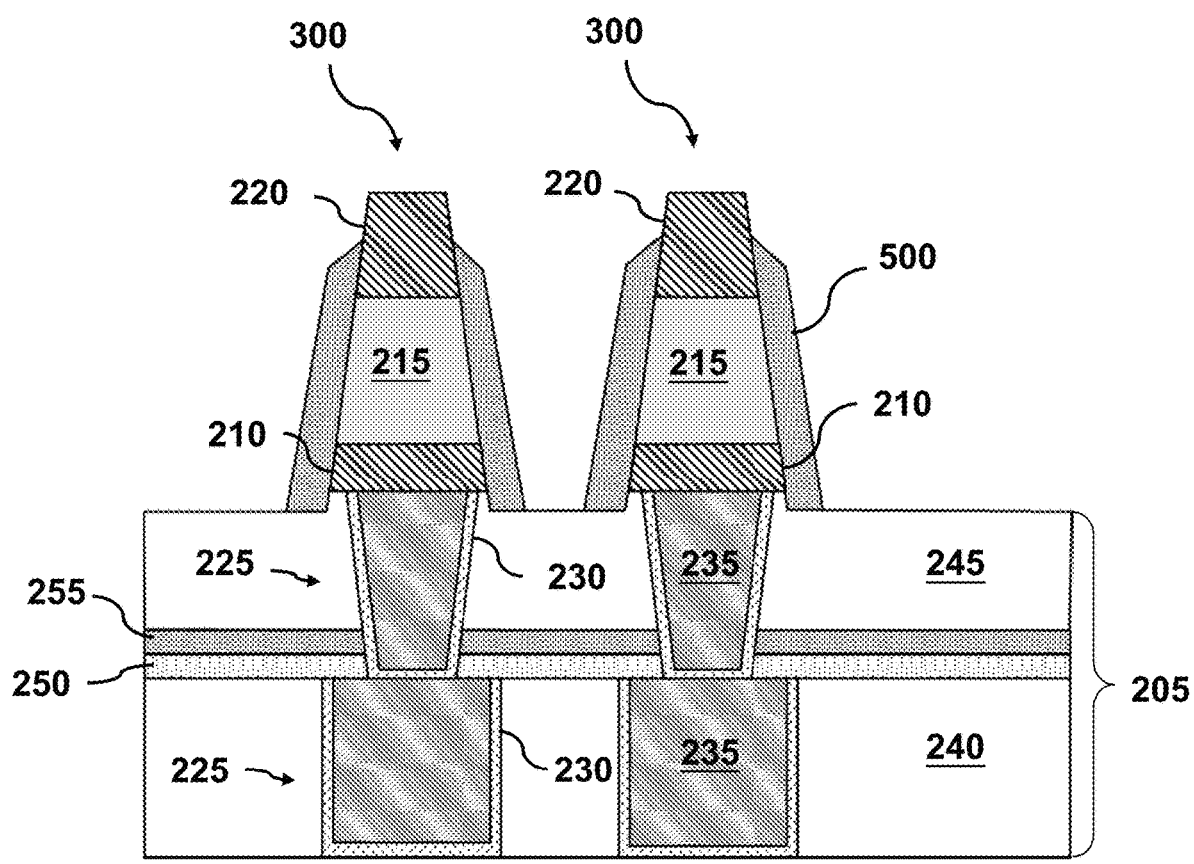
FIG. 5 is a cross-sectional view of magnetic tunnel junction structures over an interconnect layer after an etch-back process of a first spacer layer, according to some embodiments.

After the deposition of first spacer material 400, an anisotropic etchback process can be used to selectively remove first spacer material 400 from the horizontal surfaces of MTJ structures 300 (e.g., from top surface of top electrode 220) and ILD layer 245. The anisotropic etchback process (e.g., a directional etch process) can be configured to exhibit higher removal rates for first spacer material 400 on horizontal surfaces (e.g., at least 2 times higher or more) than on non-horizontal surfaces, such as the sidewall surfaces of MTJ structures 300. Consequently, the un-etched portions of first spacer material 400 that cover the sidewall surfaces of MTJ structure 300 can form first spacers 500 as shown in FIG. 5. In some embodiments, due to the anisotropic nature of the etchback process, first spacer material 400 is recessed from the top corners of top electrodes 220. Consequently, first spacers 500 do not cover the entire sidewall surface of top electrode 220, as shown in FIG. 5.

According to some embodiments, the anisotropic etchback process can include an ion beam etch process or a reactive ion etching (RIE) process with an inductively coupled plasma (RIE-ICP). In some embodiments, the ion beam etch process can use an ion beam that selectively targets areas where the etching will be performed. The ion beam can be produced from a helium (He), neon (Ne), argon (Ar), krypton (Kr), or xenon (Xe) plasma. By way of example and not limitation, the energy of the ion beam during the etch process can be between about 100 eV and about 1200 eV. Alternatively, the RIE-ICP process can use etchants such as tetrafluoromethane ($CF_4$), fluoroform ($CH_2F_2$), chlorine ($Cl_2$), Ar, He, organic gases, or combinations thereof.

Figure 6:
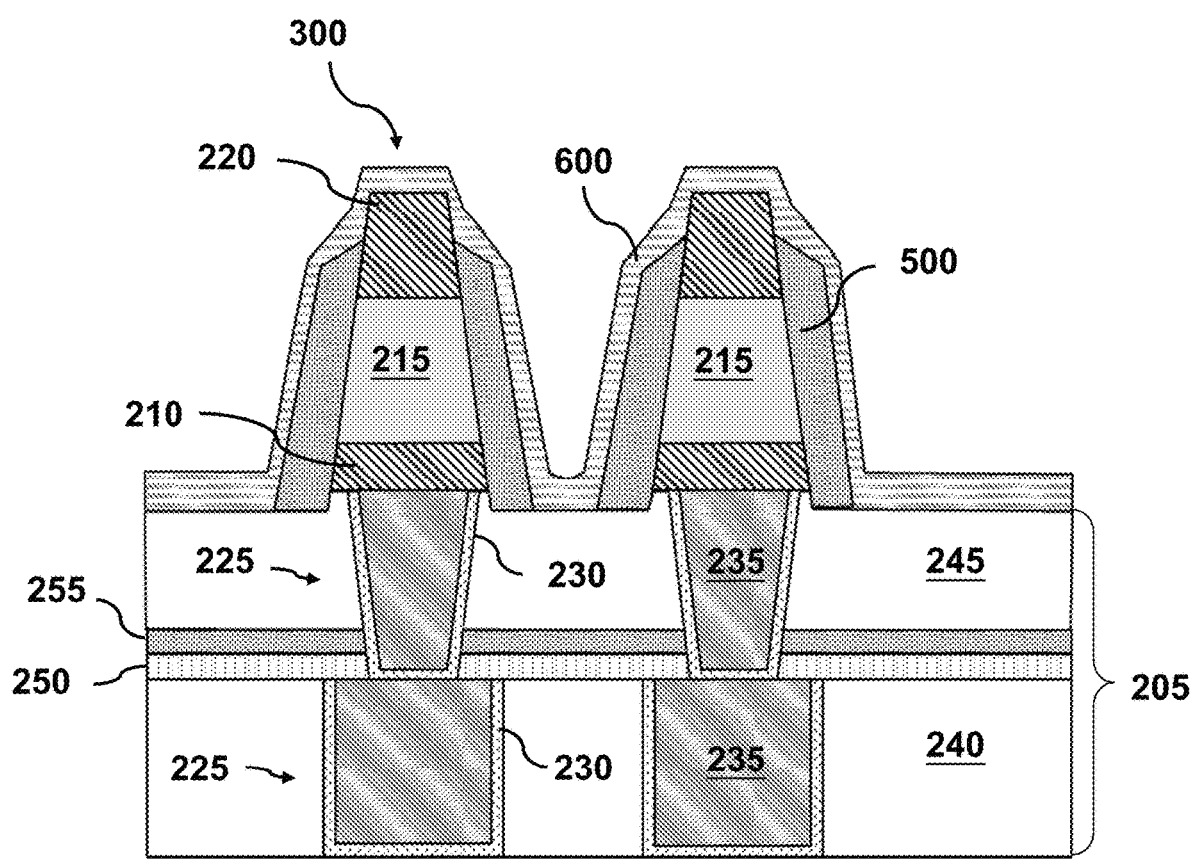
FIG. 6 is a cross-sectional view of magnetic tunnel junction structures over an interconnect layer after a deposition of a metallic compound layer, according to some embodiments.

In referring to FIG. 1, method 100 continues with operation 130, where a metallic compound layer is deposited over the first spacers, the one or more MTJ structures 300, and top interconnect layer 205. For example, as shown in FIG. 6, a metallic compound layer 600 can be conformally deposited over first spacer 500, MTJ structures 300, and interconnect layer 205. According to some embodiments, metallic compound layer 600 can be conformally deposited by a thermal ALD or a plasma-enhanced ALD process at a thickness between about 5 Å and about 50 Å (e.g., about 30 Å). In other words, the as-deposited metallic compound layer 600 can be thinner than first spacer 500. In a thermal ALD process the deposition temperature can range from about 150° C. to about 400° C. On the other hand, the deposition temperature for a plasma-enhanced process can be lower. For example, the deposition temperature for a plasma-enhanced process can be between about 50° C. and about 350° C. (e.g., 100° C., 150° C., 200° C., 350° C., etc.). In some embodiments, the process pressure for both thermal and plasma-enhanced ALD can range from about 0.5 Torr to about 10 Torr. The aforementioned process pressure range is exemplary and other ranges may be used. According to some embodiments, metallic compound layer 600 can include aluminum nitride ($AlN_x$), aluminum oxide ($AlO_{o_x}$), titanium nitride (TiN), titanium oxide ($TiO_x$), ruthenium oxide ($RuO_x$), or any other suitable material. For example purposes metallic compound layer 600 in method 100 will be described in the context of an aluminum-based layer, such as aluminum nitride and aluminum oxide. Based on the disclosure herein, other metallic compound layers, as discussed above, can be used. These other metallic compound layers are within the spirit and scope of this disclosure.

For metallic compound layer 600 that includes aluminum nitride or aluminum oxide, a trimethylaluminum (TMA) ($Al_2(CH_3)_6$) precursor can be used as the aluminum source for the deposited film. By way of example and not limitation, the formation of aluminum nitride can be described as follows. Initially, first spacers 500, MTJ structures 300, and ILD layer 245 are thermally pre-treated with ammonia ($NH_3$); for example, the wafer with MTJ structures 300 and interconnect layers 205 is exposed to ammonia ($NH_3$) gas. Alternatively, first spacers 500, MTJ structures 300, and ILD layer 245 can be treated with a plasma. In some embodiments, the plasma can include (i) a mixture of ammonia with helium, hydrogen, or argon; (ii) a mixture of nitrogen with helium, hydrogen, or argon. The plasma treatment can be performed at a temperature similar to the deposition temperature (e.g., between about 150° C. and about 400° C.) and at a process pressure similar to the deposition process pressure (e.g., between about 0.5 Torr and about 10 Torr). As a result of the pre-treatment (e.g., thermal or plasma), amino radicals ($NH_2$) can be chemisorbed on the exposed surfaces of first spacers 500, MTJ structures 300, and ILD layer 245. Unreacted $NH_3$ gas can be subsequently removed with a purge. A TMA soak can follow, where the precursor is introduced and allowed to chemically react with the amino radicals on the exposed surfaces. As a result of the reaction, the precursor partially decomposes (e.g., releases a methyl group) and attaches itself to the amino radicals on the surface. A subsequent purge removes any unreacted TMA precursor along with the byproducts (e.g., methane, $CH_4$) of the reaction between the amino radicals and the TMA precursor. $NH_3$ gas is then re-introduced to react with the partially decomposed precursor to form aluminum nitride. A subsequent purge removes the byproducts of the chemical reaction (e.g., methane) and any unreacted $NH_3$ gas.

The above process sequence produces aluminum nitride films with a thickness that ranges from about 2 Å to about 5 Å depending on the process conditions (e.g., process pressure, temperature, gas and precursor flow, etc.). Consequently, the deposition process sequence can be repeated as needed until the desired thickness of aluminum nitride metallic compound layer is achieved (e.g., between about 5 Å and about 50 Å).

In some embodiments, a post-treatment can be used to densify the deposited aluminum nitride by removing hydrogen. For example, a radio frequency (RF) $NH_3$ plasma can be used to remove hydrogen from the aluminum nitride layer. The RF power applied to the plasma can range from about 100 Watts to about 500 Watts, according to some embodiments. However, the aforementioned RF power range should not be considered limiting and other ranges may be used. By way of example and not limitation, the post-treatment can last for up to one minute and can be performed in-situ with the deposition process described above. The aluminum to nitrogen ratio (Al/N) of the resulting aluminum nitride layer can be between about 0.67 and about 2.3. Consequently, the aluminum atomic percentage in the aluminum nitride layer can range from about 40 to about 70, and the nitrogen atomic percentage from about 30 to about 60, as measured by X-ray photoelectron spectroscopy (XPS) or other appropriate method. Since the source of aluminum is TMA (e.g., an organometallic precursor), traces of residual carbon can be found in the aluminum nitride layer. For example, the carbon atomic percentage in the aluminum nitride layers can range from about 1 to about 2. In some embodiments, the dielectric constant of the treated aluminum nitride can be between about 7 and about 8, and its density between about 2 $g/cm^3$ and about 3 $g/cm^3$, as measured by X-ray reflectometry. Due to their high dielectric constant and density, thin aluminum nitride layers (e.g., less than 50 Å) can provide improved electrical isolation compared to layers with lower dielectric constant such as silicon oxide, silicon nitride, silicon carbon nitride, and the like.

The deposition of aluminum oxide metallic compound layers is very similar to the process sequence described above for aluminum nitride. However, in the case of aluminum oxide deposition, the $NH_3$ exposure after the TMA purge can be replaced with 1-butanol ($C_4H_9OH$) soak, where the partially decomposed TMA precursor can react with 1-butanol to form aluminum-oxygen bonds, and ultimately aluminum oxide. Similarly to the case of aluminum nitride, a post-treatment with RF $NH_3$ plasma can be used to densify the as-deposited aluminum oxide metallic compound layer by removing hydrogen. The RF power applied to the plasma can range from about 100 Watts to about 500 Watts, according to some embodiments. The resulting aluminum oxide film can have an oxygen to aluminum ratio (O/Al) that ranges from about 1.2 to about 2.3. Further, the aluminum atomic percentage can be between about 30 to about 45, while the oxygen atomic percentage can be between about 55 to about 70, as measured by XPS. By way of example and not limitation, the hydrogen atomic percentage in the plasma treated aluminum oxide film can range from 0 to about 3, as measured by Rutherford Backscattering Spectrometry (RBS). In some embodiments, the formed aluminum oxide metallic compound layer can have a dielectric constant between about 7 and about 9.5, and its density can be between about 3 $g/cm^3$ and about 3.5 $g/cm^3$, as measured by X-ray reflectometry. Due to their high dielectric constant and density, thin aluminum oxide layers (e.g., less than 50 Å) can provide improved electrical isolation compared to layers with lower dielectric constants such as silicon oxide, silicon nitride, silicon carbon nitride, and the like.

Figure 7:
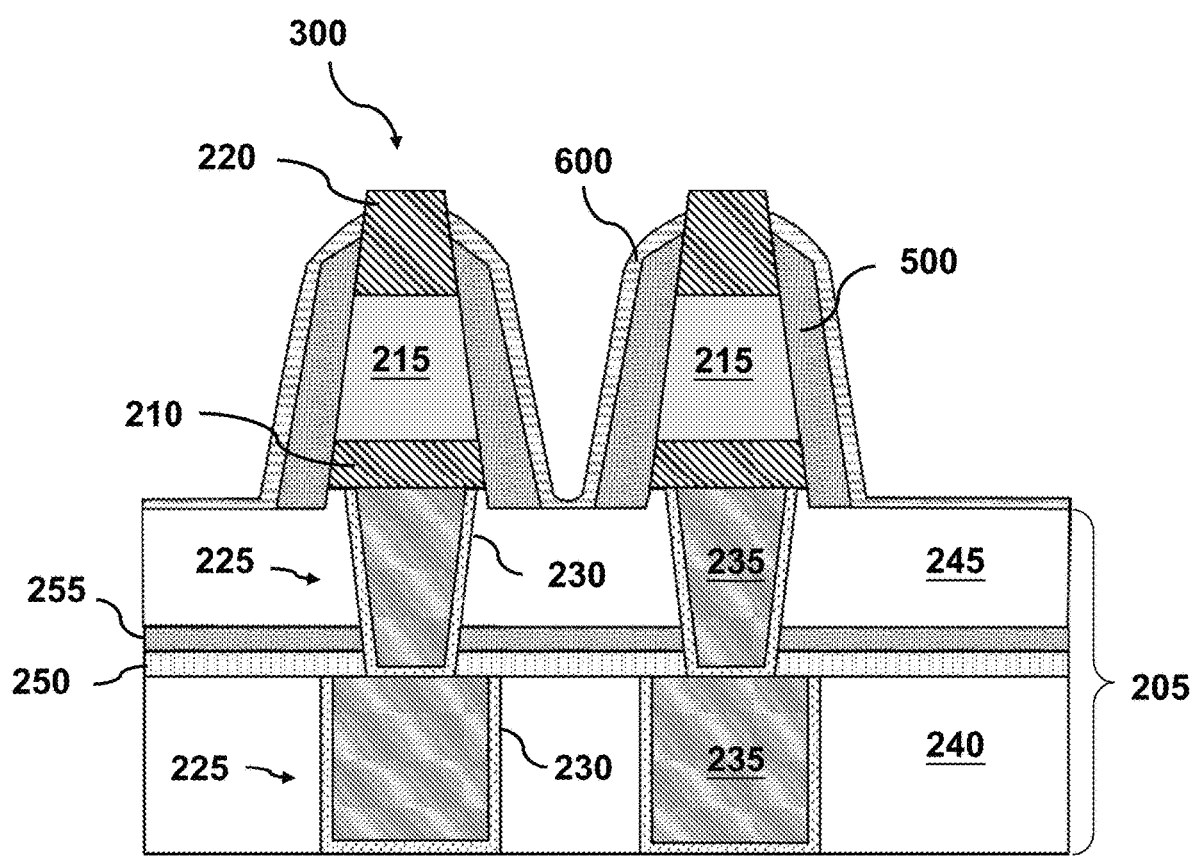
FIG. 7 is a cross-sectional view of magnetic tunnel junction structures over an interconnect layer after an etch-back process of a metallic compound layer, according to some embodiments.

In referring to FIGS. 1 and 7, method 100 continues with operation 140, where an etchback process can be used to recess metallic compound layer 600 so that a second spacer 600 can be formed over each sidewall of MTJ structures 300. In some embodiments, the etchback process will partially remove metallic compound layer 600 over the top surface of ILD layer 245 and will expose portions of top electrode 220 of MTJ structures 300, as shown in FIG. 7. In some embodiments, the etchback process of operation 120 can be used over in operation 140. For example, the etchback process of operation 140 can use an ion beam etch process or a reactive ion etching (RIE) process with an inductively coupled plasma (RIE-ICP). In some embodiments, the ion beam etch process can use an ion beam that selectively targets areas where the etching will be performed. The ion beam can be produced from a helium (He), neon (Ne), argon (Ar), krypton (Kr), or xenon (Xe) plasma. By way of example and not limitation, the energy of the ion beam during the etch process can be between about 100 eV and about 1200 eV. Alternatively, the RIE-ICP process can use etchants such as tetrafluoromethane ($CF_4$), fluoroform ($CH_2F_2$), chlorine ($Cl_2$), Ar, He, organic gases, or combinations thereof. The etchback process used to form the first and second spacers (e.g., first spacer 500 and second spacer 600) is not limiting to the etchback processes described above. Therefore, alternative etchback processes can be used to form first spacer 500 and second spacer 600. Further, in some embodiments, the aluminum nitride or aluminum oxide metallic compound layers 600 can exhibit an etch selectivity from about 2:1 to about 10:1 (e.g., 2:1, 5:1, 8:1, 10:1). However, the aforementioned selectivity range is not limiting and higher selectivity ratios are possible (e.g., 50:1).

Figure 8:
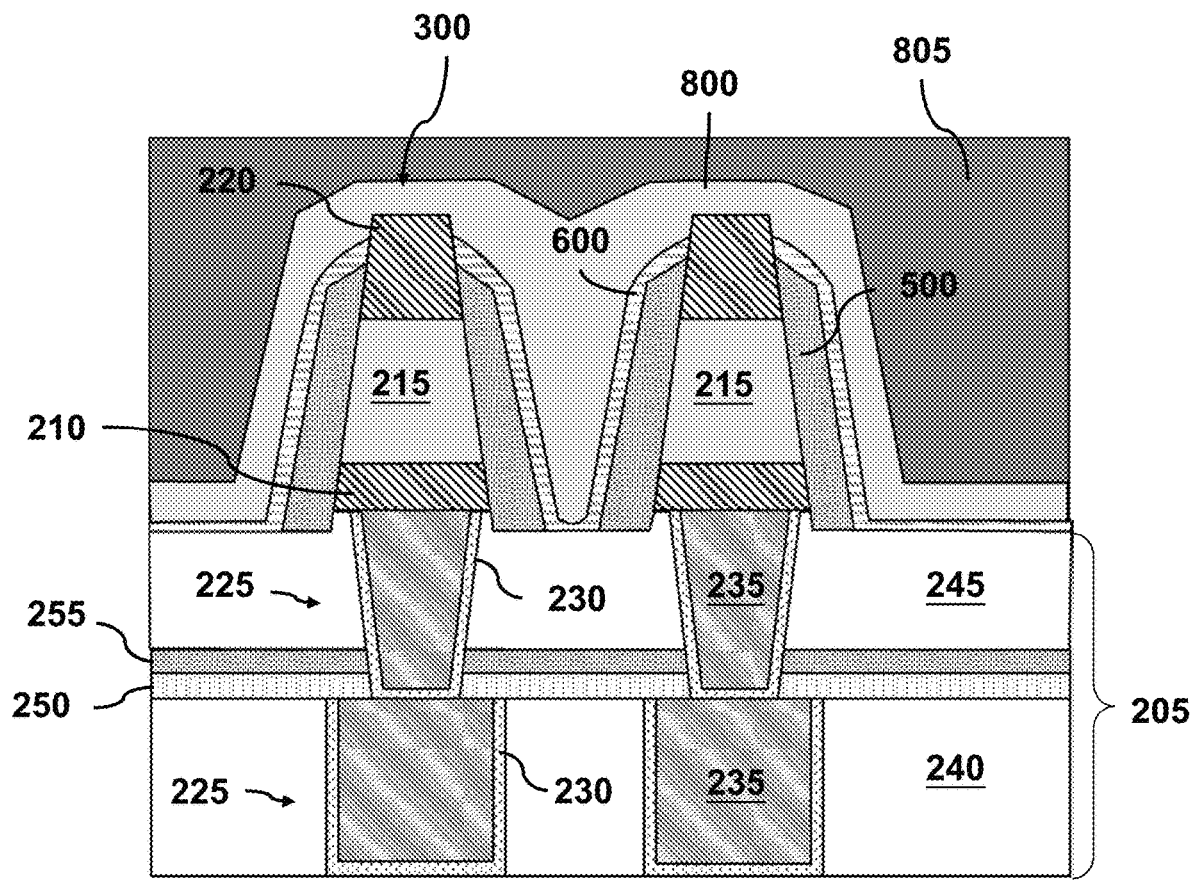
FIG. 8 is a cross-sectional view of magnetic tunnel junction structures over an interconnect layer after deposition of a third spacer layer and a dielectric layer, according to some embodiments.

In referring to FIG. 1, method 100 continues with operation 150 and the formation of a third spacer over the second spacer (e.g., etched metallic compound layer 600). Referring to FIG. 8, a third spacer 800 can be blanket-deposited over metallic compound layer 600. In some embodiments, third spacer 800 includes a dielectric material, such as silicon nitride, silicon carbon nitride, silicon oxide, carbon doped silicon oxide, or silicon oxy-carbon nitride with a thickness between about 100 Å and about 500 Å (e.g., about 150 Å). Therefore, in some embodiments, third spacer 800 can be thicker than metallic compound layer 600 (e.g., second spacer). As discussed above, pitch P between MTJ structures 300, shown in FIG. 1, can range from about 92 nm and 80 nm. Therefore, the spacing between MTJ structures 300, after the formation of the first and second spacers, will be reduced to less than 80 nm. Consequently, it is desirable that third spacer 800 can be deposited with a deposition method with enhanced gap-fill characteristics. By way of example and not limitation, third spacer 800 can be deposited by PEALD, CVD, ALD, or a deposition method with enhanced gap-fill capabilities so that third spacer 800 can fill the space between MTJ structures 300, as shown in FIG. 8.

According to some embodiments, first spacer 500, metallic compound layer 600 (second spacer), and third spacer 800 form a spacer stack where metallic compound layer 600 (second spacer) is thinner than first spacer 500 and third spacer 800. Further, the spacer stack can have a thickness that ranges from about 30 nm.

Figure 9:
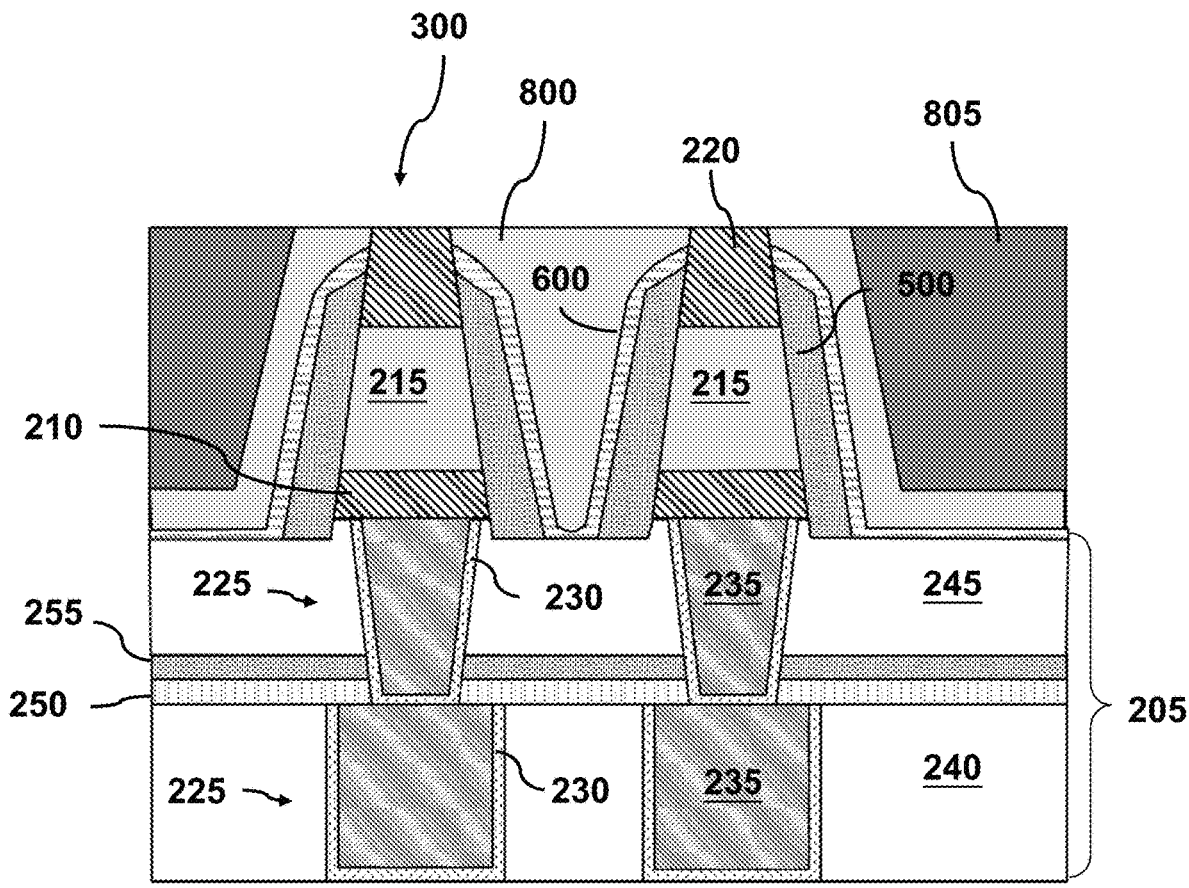
FIG. 9 is a cross-sectional view of magnetic tunnel junction structures with a spacer stack over an interconnect layer after a chemical mechanical planarization process, according to some embodiments.

In some embodiments, a dielectric layer 805 can be deposited over third spacer 800. By way of example and not limitation, dielectric layer 805 can be a silicon oxide (SiO$_2$) interlayer dielectric grown with tetraethoxysilane (TEOS). Alternatively, dielectric layer 805 can be a low dielectric constant interlayer dielectric; e.g., with a dielectric constant lower than 3.9. In some embodiments, dielectric layer 805 can have a thickness of about 500 Å or more. A chemical mechanical planarization (CMP) process can polish dielectric layer 805 so that the top surface of top electrodes 220 and the top surface of dielectric layer 805 can be substantially coplanar, as shown in FIG. 9. According to some embodiments, additional interconnect layers (not shown in FIG. 9) can be formed over the planarized surfaces of dielectric layer 805 and MTJ structures 300 so that top electrodes 220 can be connected to respective vias in the interconnect layer over MTJ structures 300.

In some embodiments, spacer stacks with metallic compound layers, such as aluminum nitride or aluminum oxide, can exhibit improved dielectric properties compared to spacer stacks limited to silicon-based layers such as silicon nitride, silicon carbon nitride, silicon oxide, carbon doped silicon oxide, or silicon oxy-carbon nitride. Therefore, spacer stacks with metallic compound layers can be compact (e.g., with a thickness below about 50 Å) and suitable for MRAM cells with a tight pitch between MTJ structures (e.g., between about 80 nm and about 92 nm). Further, spacer stacks with metallic compound layers, exhibit improved etch characteristics. For example, spacer stacks with metallic compound layers can demonstrate improved etch resistance and selectivity (e.g., between about 2:1 and about 10:1). As a result, spacer stacks with metallic compound layers can be less susceptible to etch damage during a subsequent etch-back process.

The present disclosure is directed to an exemplary fabrication method for forming spacer stacks with metallic compound layers therein. In some embodiments, the metallic compound layers can improve the electrical isolation between adjacent MTJ structures. By way of example and not limitation, the spacer stack can include a 5 nm, or thinner (e.g., about 3 nm), metallic compound layer that can include aluminum oxide, aluminum nitride, titanium oxide, titanium nitride, ruthenium oxide, or any other suitable material. The metallic compound layer can be interposed between layers of silicon nitride, silicon carbon nitride, silicon oxy-nitride, silicon oxy-carbon nitride, silicon oxide, or combinations thereof to form a spacer stack on each sidewall surface of the MTJ structure. In some embodiments, the metallic compound layer can be conformally deposited with a thermal atomic layer deposition or a plasma-enhanced atomic layer deposition process. According to some embodiments, spacer stacks with metallic compound layers exhibit improved electrical isolation characteristics compared to spacer stacks without metallic compound layers and can therefore be more compact (e.g., thinner).

In some embodiments, a method includes forming magnetic tunnel junction (MTJ) structures on an interconnect layer. The method also includes depositing a first spacer layer over the MTJ structures and the interconnect layer, where the first spacer layer is etched to expose the top electrodes of the MTJ structures and the interconnect layer. The method further includes depositing a second spacer layer over the first spacer layer, the MTJ structures, and the interconnect layer; where the second spacer layer is thinner than the first spacer layer and includes a metallic compound. Additionally the method includes etching the second spacer layer to expose the top electrodes of the MTJ structures.

In some embodiments, a structure includes a substrate with transistors, contact layers, and one or more interconnect layers disposed thereon. The structure further includes one or more MTJ structures over the one or more interconnect layers, where bottom electrodes of the one or more MTJ structures are disposed on vias in a top interconnect layer of the one or more interconnect layers. The structure also includes a first spacer on each sidewall surface of the one or more MTJ structures and a metallic compound layer over each sidewall surface of the one or more MTJ structures and over the top interconnect layer, where the metallic compound layer forms a second spacer that is thinner than the first spacer. The structure also includes a third spacer on the metallic compound layer, where the third spacer is thicker than the second spacer and is disposed between the MTJ structures.

In some embodiments, a structure includes an interconnect layer with lines and vias over a substrate and MTJ structures disposed over the vias in the interconnect layer, where the bottom electrodes of the MTJ structures are in contact with vias in the interconnect layer. The structure further includes a first spacer on each sidewall surface of the MTJ structures and a second spacer over the first spacer and the interconnect layer, where the second spacer includes a metallic compound layer.

The foregoing outlines features of embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
a substrate with transistors, contact layers, and one or more interconnect layers disposed thereon;
one or more magnetic tunnel junction (MTJ) structures over the one or more interconnect layers; wherein bottom electrodes of the one or more MTJ structures are disposed on conductive structures in a top interconnect layer of the one or more interconnect layers;
a first spacer on each sidewall surface of the one or more MTJ structures, wherein a bottom surface of the first spacer is disposed below top surfaces of the conductive structures in the top interconnect layer;

a metallic compound layer covering all sidewall surfaces of the first spacer not in direct contact with the one or more MTJ structures, wherein the metallic compound layer forms a second spacer; and a third spacer on the metallic compound layer, wherein the third spacer is thicker than the second spacer and is disposed between the one or more MTJ structures.

2. The structure of claim 1, wherein the first spacer, the metallic compound layer, and the third spacer form a spacer stack with a thickness less than 30 nm.

3. The structure of claim 1, wherein the metallic compound layer comprises an aluminum-based nitride or an aluminum-based oxide with a thickness between 5 Å and 50 Å.

4. The structure of claim 1, wherein the metallic compound layer comprises an aluminum oxide layer with an oxygen to aluminum ratio between 1.2 and 2.3 and an aluminum atomic percentage between 30 and 45.

5. The stricture of claim 1, wherein the metallic compound layer comprises titanium oxide, titanium nitride, or ruthenium oxide.

6. The structure of claim 1, wherein the one or more MTJ structures comprise top electrodes and each of the first, second, and third spacers cover different vertical sidewall portions of the top electrodes.

7. The structure of claim 1, wherein the third spacer has a thickness less than 200 Å and comprises silicon nitride, silicon carbon nitride, silicon oxide, carbon doped silicon oxide, silicon oxy-carbon nitride, or combinations thereof.

8. The structure of claim 1, further comprising:
an interlayer dielectric surrounding the third spacer; and
another interconnect layer over the interlayer dielectric and the one or more MTJ structures, wherein top electrodes of the one or more MTJ structures are in contact with conductive structures in the another interconnect layer.

9. A structure, comprising:
an interconnect layer over a substrate and comprising lines and vias;
magnetic tunnel junction (MTJ) structures disposed over the vias in the interconnect layer, wherein bottom electrodes of the MTJ structures are in contact with vias in the interconnect layer;
a first spacer on each sidewall surface of the MTJ structures; and
a second spacer over the first spacer and in direct contact with the interconnect layer, wherein the second spacer comprises a metallic compound layer and a bottom surface of the second spacer is below top surfaces of the vias in the interconnect layer.

10. The structure of claim 9, further comprising
a third spacer; and
a dielectric layer surrounding the third spacer, wherein a top surface of the dielectric layer is coplanar with a top surface of the third spacer and top surfaces of top electrodes of the MTJ structures.

11. The structure of claim 10, wherein a combined thickness of the first, second, and third spacers is less than 30 nm.

12. The structure of claim 9, wherein the MTJ structures are separated by a pitch that ranges from 92 nm to 80 nm.

13. The structure of claim 9, wherein the metallic compound layer is less than 50 Å thick and comprises aluminum oxide, aluminum nitride; titanium nitride, titanium oxide, or ruthenium oxide.

14. The structure of claim 9, wherein an additional interconnect layer, contact layers, and transistors are interposed between the interconnect layer and the substrate.

15. A structure, comprising:
a substrate with an interconnect layer formed thereon;
magnetic tunnel junctions (MTJs) spaced apart from each other, wherein each magnetic tunnel junction (MTJ) comprises a multilayer structure interposed between a bottom electrode and a top electrode;
a first spacer on sidewall surfaces of the bottom electrode, sidewall surfaces of the multilayer structure, and a first sidewall portion of the top electrode of each MTJ;
a second spacer on the first spacer and in direct contact with the top electrode, wherein the second spacer comprises a metallic compound, and wherein bottom surfaces of the first and second, spacers are formed below a top surface of the interconnect layer; and
a third spacer on the second spacer and on a second sidewall portion of the top electrode, wherein the third spacer is disposed in a space between the MTJs.

16. The structure of claim 15, wherein the first and second sidewall portions are non-overlapping.

17. The structure of claim 15, wherein a top surface of the top electrode is substantially coplanar to a top surface of the third spacer.

18. The structure of claim 15, wherein the metallic compound comprises a metal oxide.

19. The structure of claim 18, wherein the metal oxide comprises titanium or ruthenium.

20. The structure of claim 15, wherein each of the first and second sidewall portions of the top electrode are vertical sidewall portions separated by the second spacer.

* * * * *